(12) United States Patent
Mehrotra

(10) Patent No.: US 6,599,802 B2
(45) Date of Patent: Jul. 29, 2003

(54) LOW-VOLTAGE-VT (CMOS) TRANSISTOR DESIGN USING A SINGLE MASK AND WITHOUT ANY ADDITIONAL IMPLANTS BY WAY OF TAILORING THE EFFECTIVE CHANNEL LENGTH (LEFF)

(75) Inventor: Manoj Mehrotra, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 49 days.

(21) Appl. No.: 10/007,030

(22) Filed: Nov. 8, 2001

(65) Prior Publication Data

US 2002/0086484 A1 Jul. 4, 2002

Related U.S. Application Data

(60) Provisional application No. 60/259,278, filed on Dec. 31, 2000.

(51) Int. Cl.[7] .............................................. H01L 21/336
(52) U.S. Cl. ........................................ 438/276; 438/303
(58) Field of Search ................................. 438/174, 194, 438/289, 230, 282, 303, 217, 276, 253, 396; 257/376, 500–502, 327–334

(56) References Cited

U.S. PATENT DOCUMENTS

| 5,998,274 A | * | 12/1999 | Akram et al. ................ 438/306 |
| 6,111,298 A | * | 8/2000 | Gardner et al. ............. 257/411 |
| 6,432,778 B1 | * | 8/2002 | Lai et al. ..................... 438/276 |

* cited by examiner

Primary Examiner—Matthew Smith
Assistant Examiner—Calvin Lee
(74) Attorney, Agent, or Firm—Jacqueline J. Garner; W. James Brady, III; Frederick J. Telecky, Jr.

(57) ABSTRACT

Low threshold voltage transistors are fabricated by removing oxide spacers from the poly gate sidewalls of the transistors that are to be low threshold voltage. This causes the effective channel length of the low Vt transistors to be shorter than that of the core transistors, which causes lower threshold voltage.

2 Claims, 3 Drawing Sheets

FIG. 4

| Process step | CORE | | | Low-Vt | | |
|---|---|---|---|---|---|---|
| | Lmask | Lpoly | Leff (TLD=300) | Lmask | Lpoly | Leff (TLD=300) |
| Post gate etch | L | L | | L | L | |
| Post poly re-ox (60A on moat) (115 on sidewall) | L+130 | L-100 | | L+130 | L-100 | |
| Post strip for low-Vt | L+130 | L-100 | | L-100 | L-100 | |
| Post subsequent re-ox (if any) (20A on moat) (30A on sidewall) | L+130+5 | L-100-5 | L+130+5-300 | L-100+33 | L-100-26 | L-100+33-300 |
| Final | L+135 | L-105 | L-211 | L-67 | L-126 | L-367 |

LOW-VOLTAGE-VT (CMOS) TRANSISTOR DESIGN USING A SINGLE MASK AND WITHOUT ANY ADDITIONAL IMPLANTS BY WAY OF TAILORING THE EFFECTIVE CHANNEL LENGTH (LEFF)

This application claims priority under 35 USC §119(e)(1) of provisional application No. 60/259,278 filed Dec. 31, 2000.

BACKGROUND AND SUMMARY OF THE INVENTION

The present invention relates to integrated circuit structures and fabrication methods, and particularly to CMOS integrated circuits which include both normal logic transistors and lower-threshold transistors with leakage characteristics which would not be acceptable for all transistors on chip.

BACKGROUND

As power supply voltages are scaled lower, one of the difficult tradeoffs for process and circuit designers has been where to set threshold voltages. Reducing the magnitude of threshold voltages produces faster switching, but higher leakage currents.

One known approach to this dilemma is to provide BOTH standard and reduced-threshold-voltage transistors: the reduced-threshold-voltage transistors can be used for fast signal propagation, and the standard transistors can be used, for example, to power off signal paths or blocks which are not being used.

This approach is very attractive, but previous implementations have significantly increased process complexity. For example, in a CMOS process four types of small MOS transistors would have to be specified, in addition to any bipolar, high-voltage, or other special device types.

Low Vt Transistor by Tailoring Effective Channel Length

The present application discloses a way to fabricate low Vt transistors that decreases the number of process steps. In the preferred embodiment, a single mask is used to completely or partially remove the oxide spacer surrounding the polysilicon gate on the low Vt transistors only. This is followed by the standard CMOS process, except that no special implants are necessary to alter the threshold voltages of the low Vt transistors. This is because the effective channel length of the low Vt transistors is smaller than that for the core transistors for the same extension implants.

Advantages of the disclosed methods and structures, in various embodiments, can include one or more of the following:

reduced number of mask steps needed for fabricating different threshold voltage transistors in same process;

reduced number of implant steps for low Vt transistors.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 4 shows a chart comparing core and low Vt transistor dimensions.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
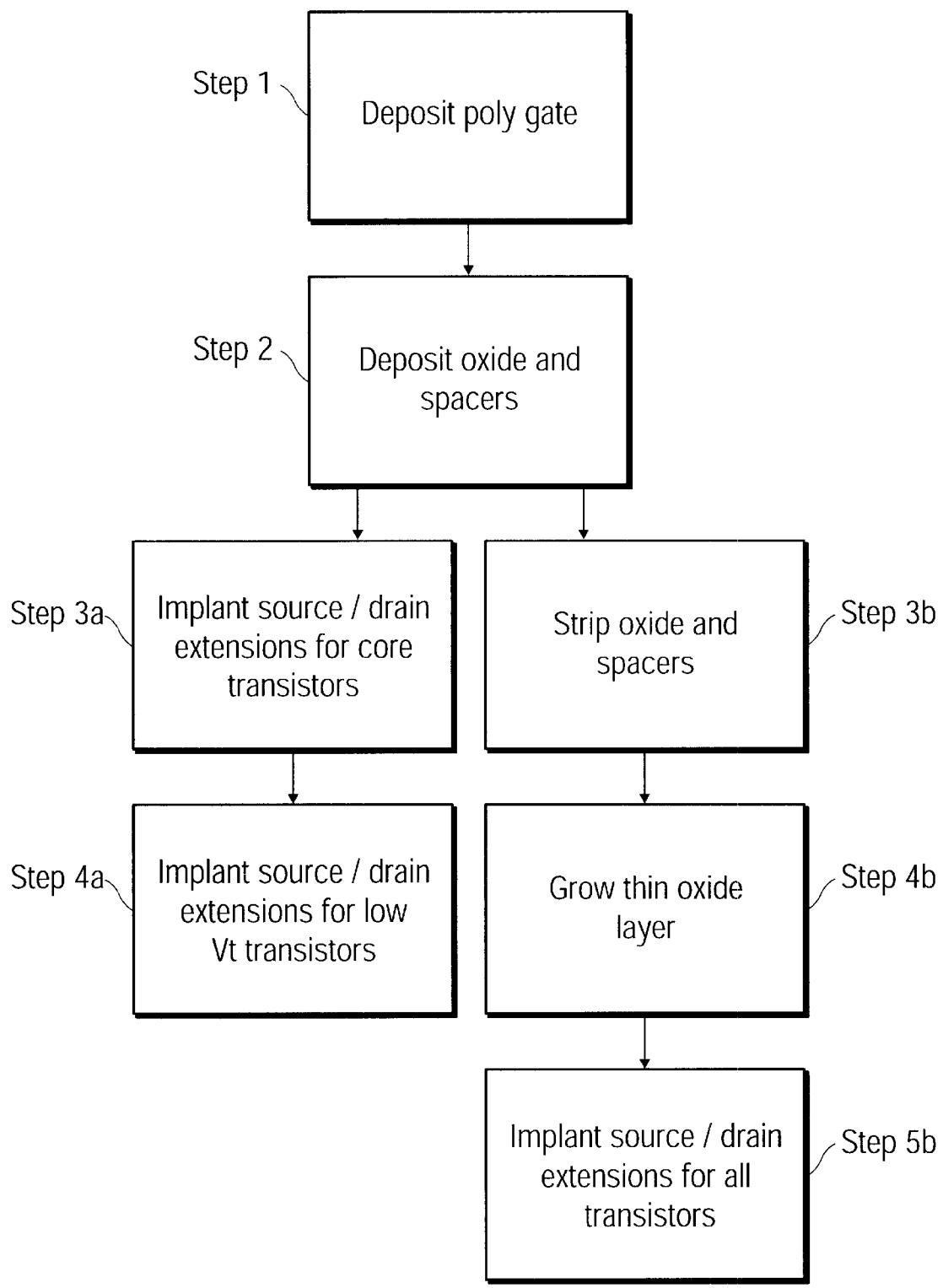
FIG. 1 shows a flow chart of the presently preferred embodiment.

Partial process sequences for both a conventional process and the preferred embodiment are shown in FIG. 1. In the first step for both processes, the poly gate is deposited (step 1). Next, an oxide is grown on the poly, with spacers on the sidewalls of the poly. This step is often referred to as reoxidation (step 2). These spacers determine the effective channel length by blocking the implanted ions from reaching the source/drain extensions.

Here the two processes diverge. For the conventional process, the source/drain extension implants are performed for the core transistors (step 3a) followed by another set of implants for the low Vt transistors (step 4a). For the preferred embodiment, the reoxidation step is followed by the use of a single mask that allows the oxide and spacers to be stripped from the poly gate (step 3b). This can be done using a wet-clean/isotropic plasma etch or some other cleaning technology known to those skilled in the relevant art. Next, a thin layer of oxide is regrown on the poly (step 4a). Note that this step is optional, as processing can continue without any reoxidation depending on GOI and other reliability issues for implanting into bare silicon next to bare poly. The source/drain extension implants for all transistors follows (step 5b).

The innovations of this application allow for the source/drain extension implants to be done with a single set of implants rather than two different sets of implants for the core and low Vt transistors. By removing the spacer oxide on the poly gate for low Vt transistors only, a single implantation step creates transistors with different sets of effective channel lengths. This difference is shown in the following figures.

Figure 2:
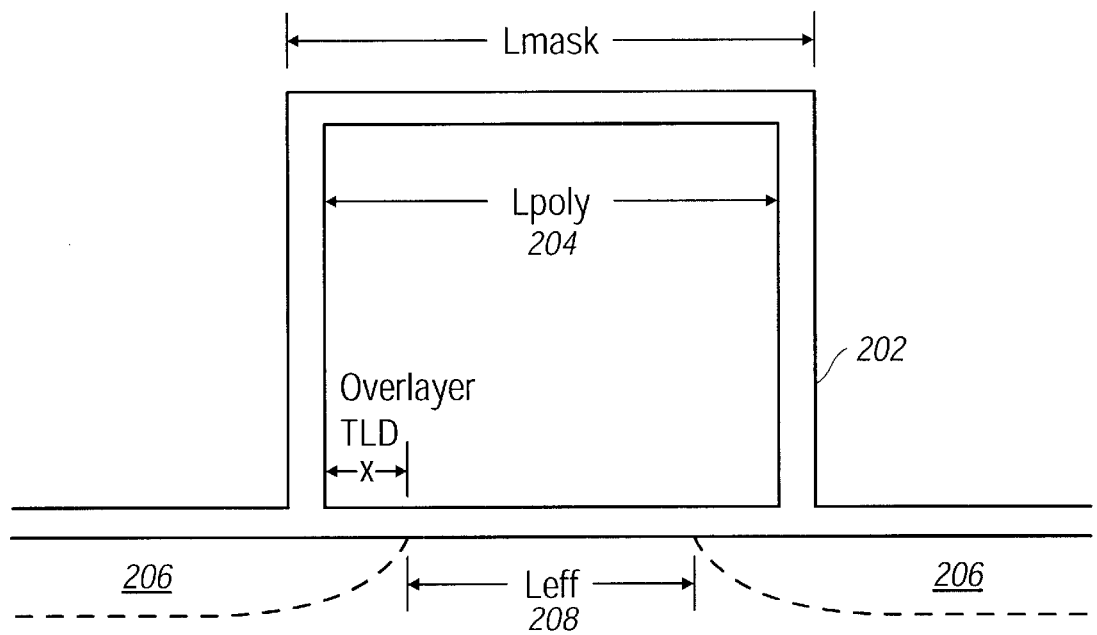
FIG. 2 shows a partially fabricated transistor structure.

FIG. 2 shows a partially fabricated transistor. The oxide spacers 202 abut the poly gate 204, creating a wide area that is not implanted during source/drain extension 206 implantation. This creates an effective channel length 208 of a particular length, which will be compared to the effective channel lengths of later figures.

Figure 3:
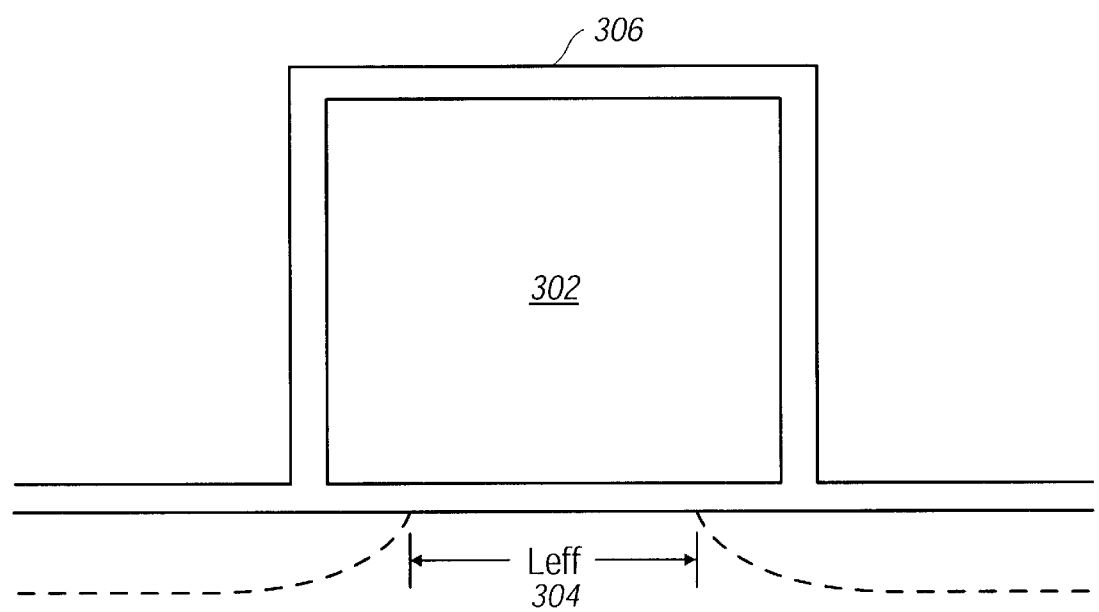
FIG. 3 shows a partially fabricated transistor structure implementing the preferred embodiment.

In FIG. 3 the oxide spacer has been removed from the poly gate 302 by a mask and etch sequence. This exposes a larger area for source/drain extension implantation, which causes the transistor to have a shortened effective channel length 304 compared to that of FIG. 2. Because of the shorter effective channel length, the transistors which had their spacers removed have a lower Vt than the core transistors. Thus two different types of threshold voltage are fabricated on the circuit without the need for special low Vt implants. A thin layer of oxide 306 may be grown before implantation (significantly thinner than the spacers), depending on process parameters.

FIG. 4 shows a chart comparing the results for core transistors and low Vt transistors. Note the difference between the mask lengths of the core and low Vt transistors. The chart shows that the length of the mask (which determines the areas affected during ion implantation) is shorter for the low Vt transistors. This is because the oxide sidewalls have been removed for the low Vt transistors. Note also that the effective channel lengths (Leff) for the two types of transistor differ. The numbers for subsequent re-oxidation differ, since poly re-ox consumes polysilicon. For example, 100 angstroms of sidewall oxide would consume about 44 angstroms of polysilicon, which helps reduce the poly width.

The overlap for the low Vt transistor will be higher than the core transistor leading to a higher gate to source/drain capacitance. However, the total gate capacitance for the low Vt transistors will be lower compared to that of the core transistors since the length of the poly for the low Vt transistors will be smaller than for the core. This results in lower gate capacitance for the low Vt transistor as the total gate capacitance is equal to the intrinsic capacitance plus the overlap capacitance and is determined by the length of the poly.

Other advantages of the present application include saving an added mask step during implantation (the conventional process requires different masks to do implants for core and low Vt transistors, while the innovative process requires only one mask to remove the spacers from the low Vt transistors); saving an extra implant for the low Vt transistors, lower Lcap in low Vt transistors in addition to higher drive current, increasing circuit speed/FOM (figure of merit).

According to various embodiments of the disclosed inventions, there is provided: An integrated circuit fabrication method, said circuit being formed using a semiconductor material, comprising the steps of: forming an oxide on said semiconductor material; forming polysilicon structures on said oxide; depositing spacers on sidewalls of said polysilicon structures; removing said spacers from selected ones of said structures, but not into others of said structures; and implanting ions into said semiconductor material; whereby, in locations where said structures are coupled to semiconductor material to form field-effect transistors therein, minimum-width ones of said selected structures form transistors having lower threshold voltage magnitudes than transistors formed by others of said structures.

According to various embodiments of the disclosed inventions, there is provided: An integrated circuit structure, comprising: polysilicon structures formed over a semiconductor material; spacers formed on the sidewalls of a first set of said structures; wherein said structures without spacers comprise a second set of said structures; wherein said spacers block ions implanted into said semiconductor material; wherein said first set of structures are used to form a first set of transistors, said first set of transistors having a first effective channel length; wherein said second set of structures are used to form a second set of transistors, said second set of transistors having a second effective channel length; and wherein said second effective channel length is greater than said first effective channel length.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide.

Similarly, it will be readily recognized that the described process steps can also be embedded into hybrid process flows, such as BiCMOS or smart-power processes.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

It should also be noted that, over time, an increasing number of functions tend to be combined into a single chip. The disclosed inventions can still be advantageous even with different allocations of functions among chips, as long as the functional principles of operation described above are still observed.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTI-LEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. An integrated circuit fabrication method, said circuit being formed using a semiconductor material, comprising the steps of:

forming an oxide on said semiconductor material;

forming polysilicon structures on said oxide;

depositing spacers on sidewalls of said polysilicon structures;

removing said spacers from selected ones of said structures, but not into others of said structures;

and implanting ions into said semiconductor material;

whereby, in locations where said structures are coupled to semiconductor material to form field-effect transistors therein, minimum-width ones of said selected structures form transistors having lower threshold voltage magnitudes than transistors formed by others of said structures.

2. An integrated circuit structure, comprising:

polysilicon structures formed over a semiconductor material;

spacers formed on the sidewalls of a first set of said structures;

wherein said structures without spacers comprise a second set of said structures;

wherein said spacers block ions implanted into said semiconductor material;

wherein said first set of structures are used to form a first set of transistors, said first set of transistors having a first effective channel length;

wherein said second set of structures are used to form a second set of transistors, said second set of transistors having a second effective channel length; and wherein said second effective channel length is greater than said first effective channel length.

* * * * *